United States Patent
Maeyama et al.

(10) Patent No.: US 9,960,228 B2
(45) Date of Patent: May 1, 2018

(54) WIDE GAP SEMICONDUCTOR DEVICE AND METHOD OF MANUFACTURING THE SAME

(71) Applicant: SHINDENGEN ELECTRIC MANUFACTURING CO., LTD., Tokyo (JP)

(72) Inventors: Yusuke Maeyama, Saitama (JP); Shunichi Nakamura, Saitama (JP); Atsushi Ogasawara, Saitama (JP); Ryohei Osawa, Saitama (JP); Akihiko Shibukawa, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 79 days.

(21) Appl. No.: 15/030,864

(22) PCT Filed: Aug. 27, 2015

(86) PCT No.: PCT/JP2015/004312
§ 371 (c)(1),
(2) Date: Apr. 20, 2016

(87) PCT Pub. No.: WO2017/033216
PCT Pub. Date: Mar. 2, 2017

(65) Prior Publication Data
US 2017/0263697 A1  Sep. 14, 2017

(51) Int. Cl.
*H01L 29/872* (2006.01)
*H01L 29/06* (2006.01)
(Continued)

(52) U.S. Cl.
CPC ...... *H01L 29/0619* (2013.01); *H01L 23/3171* (2013.01); *H01L 29/1608* (2013.01);
(Continued)

(58) Field of Classification Search
CPC .......... H01L 29/0619; H01L 29/66969; H01L 29/6606; H01L 29/872; H01L 29/66143;
(Continued)

(56) References Cited

U.S. PATENT DOCUMENTS

| | | | |
|---|---|---|---|
| 2003/0038333 A1 | 2/2003 | Satoh et al. | |
| 2009/0236611 A1* | 9/2009 | Yamamoto | .......... H01L 21/0495 257/77 |

(Continued)

FOREIGN PATENT DOCUMENTS

| | | |
|---|---|---|
| JP | S63227063 A | 9/1988 |
| JP | H03185870 A | 8/1991 |

(Continued)

OTHER PUBLICATIONS

ISR for PCT/JP2015/004312 dated Dec. 1, 2015 with English translation from WIPO.

(Continued)

*Primary Examiner* — Selim Ahmed
(74) *Attorney, Agent, or Firm* — Ladas & Parry, LLP

(57) ABSTRACT

A wide gap semiconductor device comprises a first conductive-type semiconductor layer (32); a second conductive-type region (41), (42) that is provided on the first conductive-type semiconductor layer (32); a first electrode (1), of which a part is disposed on the second conductive-type region (41), (42) and the other part is disposed on the first conductive-type semiconductor layer (32); an insulating layer (51), (52), (53) that is provided adjacent to the first electrode (10) on the first conductive-type semiconductor layer (32) and that extends to an end part of the wide gap semiconductor device; and a second electrode (20) that is provided between the first electrode (10) and the end part of (Continued)

the wide gap semiconductor device and that forms a schottky junction with the first conductive-type semiconductor layer (32).

10 Claims, 10 Drawing Sheets

(51) Int. Cl.
*H01L 29/66* (2006.01)
*H01L 29/16* (2006.01)
*H01L 29/20* (2006.01)
*H01L 29/24* (2006.01)
*H01L 23/31* (2006.01)

(52) U.S. Cl.
CPC .......... *H01L 29/2003* (2013.01); *H01L 29/24* (2013.01); *H01L 29/6606* (2013.01); *H01L 29/66143* (2013.01); *H01L 29/66212* (2013.01); *H01L 29/66969* (2013.01); *H01L 29/872* (2013.01); *H01L 29/0615* (2013.01)

(58) Field of Classification Search
CPC .. H01L 29/24; H01L 29/2003; H01L 29/1608
See application file for complete search history.

(56) References Cited

U.S. PATENT DOCUMENTS

| | | |
|---|---|---|
| 2014/0264431 A1 | 9/2014 | Lai |
| 2014/0346531 A1 | 11/2014 | Imai |

FOREIGN PATENT DOCUMENTS

| | | |
|---|---|---|
| JP | 2003069045 A | 3/2003 |
| JP | 2009231321 A | 10/2009 |
| JP | 2013171902 A | 9/2013 |
| TW | 201448207 A | 12/2014 |
| WO | 2013140654 A1 | 9/2013 |

OTHER PUBLICATIONS

Written Opinion of the International Search Authority, dated Nov. 17, 2015, and its English machine translation from Bing.com Microsoft Translator.

From EP 15851643.5, extended European search report, dated Jul. 7, 2017.

"Analysis of 1.2 kV JBS rectifiers fabricated in 4H-SiC", Perez et al., Semiconductor Science and Technology, Institute of Physical Publishing Ltd., GB, vol. 21, No. 5, May 2006, pp. 670-676.

"Design, Fabrication, and Characterization of Ni/4H-SiC (0001) Schottky Diodes Array Equipped With Field Plate and Floating Guard Ring Edge Termination Structures", Gupta et al., IEEE Transactions on Semiconductor Manufacturing, vol. 25, No. 4, Nov. 2012, pp: 664-672.

ISR for PCT/JP2015/004312 dated Jan. 12, 2015.

Office action from Taiwanese Patent Application No. 105108776 dated Oct. 17, 2016, and its English translation (from Adobe OCR and Google translate.).

* cited by examiner

WIDE GAP SEMICONDUCTOR DEVICE AND METHOD OF MANUFACTURING THE SAME

CROSS-REFERENCE TO RELATED APPLICATIONS

This application is the U.S. National Stage of International Patent Application No. PCT/JP2015/004312 filed on Aug. 27, 2015, the disclosure of which is incorporated herein by reference.

TECHNICAL FIELD

The present invention relates to a wide gap semiconductor device and a manufacturing method of the wide gap semiconductor device.

BACKGROUND ART

In late years, a silicon carbide semiconductor device (SiC semiconductor device) to be an example of a wide gap semiconductor device attracts attention, because there are various advantages. However, in the silicon carbide semiconductor device, in the case in which a distance from an electrode or a wiring line formed in an active region to an end part of the silicon carbide semiconductor device becomes short, if a negative voltage such as a surge voltage is applied to an electrode of a surface side of the silicon carbide semiconductor device, there is a problem in that discharge occurs between the electrode and the end part of the silicon carbide semiconductor device (refer to Japanese Patent Application Laid-Open (JP-A) No. 2009-231321).

To prevent the problem, it is thought that a surface of a first conductive-type semiconductor layer of the silicon carbide semiconductor device is completely covered with an insulating layer (including an insulating film). However, an interface level exists at an interface between the insulating layer and the first conductive-type semiconductor layer made of silicon carbide. Particularly, an interface level density at the interface between the insulating layer and the silicon carbide becomes larger than an interface level density at an interface between the insulating layer and silicon (Si). Electrons are trapped by the interface level existing at the interface between the insulating layer and the first conductive-type semiconductor layer made of the silicon carbide. However, because electrons at a deep interface level among the captured electrons have large time constants and cannot be escaped, the electrons function as a negative fixed charge substantially (refer to FIG. 6(*a*)). Particularly, because the silicon carbide has a band gap wider than a band gap of the silicon, the fixed charge increases as $-1 \times 10^{11}$ to $-1 \times 10^{13}$ as compared with the case of the silicon. For this reason, a band is lifted by the trapped electrons in the first conductive-type semiconductor layer positioned right below the insulating layer and the first conductive-type semiconductor layer takes a second conductive type (a second conductive-type region is called an "inversion layer"). As a result, a leak current flowing through the second conductive-type region, the inversion layer, and the end part (chip terminal) of the silicon carbide semiconductor device increases. A problem in the silicon carbide semiconductor device may also occur in a wide gap semiconductor device such as gallium nitride (GaN) and gallium oxide ($Ga_2O_3$) other than the silicon carbide.

SUMMARY OF INVENTION

Technical Problem

The present invention has been made from the above viewpoint and provides a wide gap semiconductor device capable of decreasing a leak current while suppressing discharge and a manufacturing method of the wide gap semiconductor device.

Solution to Problem

A wide gap semiconductor device, according to the present invention, comprises:
a first conductive-type semiconductor layer;
a second conductive-type region that is provided on the first conductive-type semiconductor layer;
a first electrode, of which a part is disposed on the second conductive-type region and the other part is disposed on the first conductive-type semiconductor layer;
an insulating layer that is provided adjacent to the first electrode on the first conductive-type semiconductor layer and that extends to an end part of the wide gap semiconductor device; and
a second electrode that is provided between the first electrode and the end part of the wide gap semiconductor device and that forms a schottky junction with the first conductive-type semiconductor layer.

In the wide gap semiconductor device according to the present invention,
wherein one second electrode may be provided to surround some part or an entire part of the first electrode continuously or intermittently.

In the wide gap semiconductor device according to the present invention,
wherein a distance between an end part of the second conductive-type region and an end part of a contact surface between the second electrode and the first conductive-type semiconductor layer may be larger than a theoretical width of a depletion layer.

In the wide gap semiconductor device according to the present invention,
wherein the insulating layer may have the first insulating layer that is provided on the first conductive-type semiconductor layer, and
wherein the second electrode may have a protrusion part that protrudes in a planar direction on the first insulating layer.

In the wide gap semiconductor device according to the present invention,
wherein the insulating layer may have the first insulating layer that is provided on the first conductive-type semiconductor layer, and the second insulating layer that is provided on the first insulating layer and covers the second electrode completely.

In the wide gap semiconductor device according to the present invention,
the second electrode may not be provided on the end part of the wide gap semiconductor device.

In the wide gap semiconductor device according to the present invention,
wherein at least a part of second conductive-type electric field alleviation region may be provided below the second electrode.

In the wide gap semiconductor device according to the present invention, wherein the second conductive-type electric field alleviation region may include a high-concentration second conductive-type electric field alleviation region, and a low-concentration second conductive-type electric field alleviation region having a second conductive-type impurity concentration lower than a second conductive-type impurity concentration of the high-concentration second conductive-type electric field alleviation region, and wherein the high-concentration second conductive-type electric field alleviation region may be positioned at an inner side of the low-concentration second conductive-type electric field alleviation region.

A manufacturing method of a wide gap semiconductor device, according to the present invention, comprises:

providing a second conductive-type region on a first conductive-type semiconductor layer;

providing a first electrode in such a way that a part of the first electrode is disposed on the second conductive-type region and the other part is disposed on the first conductive-type semiconductor layer;

providing a second electrode, which forms a schottky junction with the first conductive-type semiconductor layer, between the first electrode and the end part of the wide gap semiconductor device; and providing an insulating layer that is adjacent to the first electrode on the first conductive-type semiconductor layer and that extends to an end part of the wide gap semiconductor device.

In the manufacturing method of the wide gap semiconductor device according to the present invention, wherein the second electrode may be provided when the first electrode is provided, and wherein the first electrode may form a schottky junction with the first conductive-type semiconductor layer.

In the manufacturing method of the wide gap semiconductor device according to the present invention, wherein a second conductive-type electric field alleviation region may be provided when the second conductive-type region is provided, and wherein the second electrode may be provided over at least a part of the second conductive-type electric field alleviation region.

Effect of Invention

According to the present invention, because the insulating layer extends to the end part of the wide gap semiconductor device, the discharge can be prevented from occurring between the first electrode and the end part of the wide gap semiconductor device. Because the second electrode is provided between the first electrode and the end part of the wide gap semiconductor device, and the second electrode and the first conductive-type semiconductor layer forms the schottky junction, the electrons are not trapped at the corresponding position and a band is not lifted. Therefore, an "inversion layer" is not formed. As a result, the leak current can be decreased.

DESCRIPTION OF EMBODIMENTS

First Embodiment

<<Configuration>>

In this embodiment, description is given using a silicon carbide semiconductor device as an example of a wide gap semiconductor device. However, the present invention is not limited thereto and the present invention can also be used in other wide gap semiconductor devices such as gallium nitride and gallium oxide.

Figure 1:
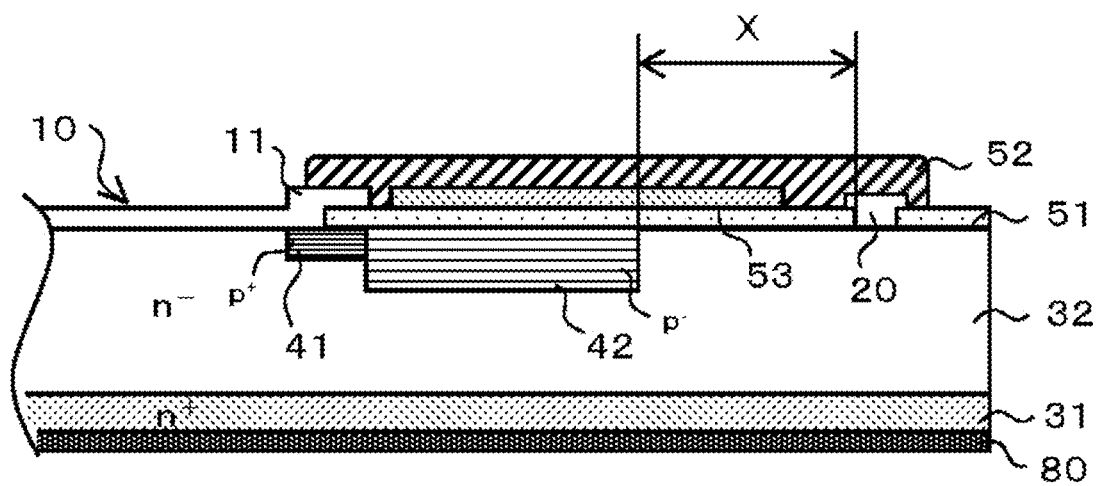
FIG. 1 is a longitudinal cross-sectional view schematically illustrating a layer configuration in a silicon carbide semiconductor device according to a first embodiment.

As illustrated in FIG. 1, the silicon carbide semiconductor device according to this embodiment includes a first conductive-type semiconductor substrate 31, a first conductive-type semiconductor layer 32 that is provided on the first conductive-type semiconductor substrate 31 and has an impurity concentration lower than an impurity concentration of the first conductive-type semiconductor substrate 31, and a second conductive-type region 41 and 42 that is provided on the first conductive-type semiconductor layer 32. In this embodiment, hereinafter, the description is given using an n type as a "first conductive type", the description is given using a p type as a "second conductive type", the first conductive-type semiconductor substrate 31 is also called the n-type semiconductor substrate 31, the first conductive-type semiconductor layer 32 is also called the n-type semiconductor layer 32, and the second conductive-type regions 41 and 42 are also called the p-type region 41 and 42. However, the present invention is not limited to such an aspect and the p type may be used as the "first conductive type" and the n type may be used as the "second conductive type". In this embodiment, a top surface of the first conductive-type semiconductor substrate 31 becomes one principal surface and a bottom surface thereof becomes the other principal surface.

The silicon carbide semiconductor device includes a first electrode 10, of which a part is disposed on the p-type region 41 and 42 and the other part is disposed on the n-type semiconductor layer 32. The first electrode 10 forms a schottky junction with the first conductive-type semiconductor layer 32. In this embodiment, the p-type region 41 and 42 is positioned below the peripheral edge part of the first electrode 10 and the p-type region 41 and 42 have a function of alleviating a field. The silicon carbide semiconductor device includes an insulating layer 51, 52, and 53 that is provided adjacent to the first electrode 10 on the n-type semiconductor layer 32 and that extends to an end part (right end part of FIG. 1) of the silicon carbide semiconductor device, and a second electrode 20 that is provided between the first electrode 10 and the end part of the silicon carbide semiconductor device and that forms a schottky junction with the n-type semiconductor layer 32. In this embodiment, the "end part of the silicon carbide semiconductor device" means a neighboring region of an end face of the silicon carbide semiconductor device. If a negative high voltage is applied in a state in which a surface of the neighboring region of the end face is not covered with the insulating layer 51, 52, and 53, the neighboring region of the end face becomes easy to be struck by lightning by electrons emitted from the first electrode 10. That is, "discharge" becomes easy to occur.

As illustrated in FIG. 1, the insulating layer 51, 52, and 53 according to this embodiment may have the first insulating layer 51 that is provided on the n-type semiconductor layer 32 and the p-type region 41 and 42, and the second insulating layer 52 that is provided on the first insulating layer 51 and covers the second electrode 20 completely. In addition, in this embodiment, the third insulating layer 53 may be provided on a top surface of the first insulating layer 51, and the second insulating layer 52 may cover the third insulating layer 53. When the second insulating layer 52 completely covers the second electrode 20, this means that the second electrode 20 is not exposed from the second insulating layer 52 in a plan view (when viewed from an upper side of FIG. 1). For example, a layer including phosphorous silicon glass (PSG) and $SiO_2$ can be used as the first insulating layer 51, a layer including polyimide, for example, highly heat-resistant polyimide can be used as the second insulating layer 52, and a layer including SiN can be used as the third insulating layer 53.

The first insulating layer 51 disposed on the surface of the neighboring region of the end face desirably reaches the end part of the semiconductor device to suppress the discharge. In this case, before dicing division, the first insulating layer 51 reaches an end part of an adjacent element. The third insulating layer 53 may be added to suppress a leak current or concentration of a field in the second conductive-type regions 41 and 42. The second insulating layer 52 to completely cover the second electrode 20 may be provided. Even in this case, as illustrated in FIG. 1, the second insulating layer 52 does not need to extend to an end face (right end face of FIG. 1) of the first insulating layer 51 (the second insulating layer may not be provided on the end part of the wide gap semiconductor device). The second insulating layer 52 is provided, so that the discharge between the first electrode 10 and the second electrode 20 can be suppressed. When the second insulating layer 52 covers the end part of the first electrode 10 and the second electrode 20, this is preferable from the viewpoint of suppressing the discharge. Meanwhile, as illustrated in FIG. 1, even when the second insulating layer does not reach the end part of the wide gap semiconductor device, suppression of the discharge can be expected. This is because the discharge can be greatly suppressed by only an effect of the first insulating layer 51 and an effect of suppressing the discharge between the first electrode 10 and the second electrode 20 by the second insulating layer 52. For example, in the case in which the second insulating layer 52 is designed to reach the end part of the wide gap semiconductor device and a polyimide resin having large viscosity is used, this causes a temporary stop of the device at the time of the dicing division. For this reason, if productivity is considered, the second insulating layer 52 does not desirably reach the end part of the wide gap semiconductor device in some cases. This point can be selected appropriately by a material applied to the second insulating layer 52 or a method of the dicing division. The first insulating layer 51 may extend to a degree where the discharge does not occur between the first electrode 10 and the end part of the silicon carbide semiconductor device. For this reason, a region where the first insulating layer 51 is not provided may exist in the vicinity of the end face of the silicon carbide semiconductor device.

As one example, an impurity concentration (for example, a nitrogen concentration) of the n-type semiconductor substrate 31 may become $5 \times 10^{17}$ cm$^{-3}$ to $5 \times 10^{19}$ and an impurity concentration of the n-type semiconductor layer 32 may become $1 \times 10^{15}$ to $1 \times 10^{18}$ cm$^{-3}$. In addition, the n-type semiconductor substrate 31 may have a thickness of 30µ to 400 µm and the n-type semiconductor layer 32 may have a thickness of 3 µm to 20 µm. In addition, the first electrode 10 may have a stack structure using a plurality of kinds of metals and may have titanium of a thickness of 0.5 µm, for example, and aluminum provided on the titanium and having a thickness of 3 µm, for example. In addition, nickel may be provided on the aluminum.

Figure 3:
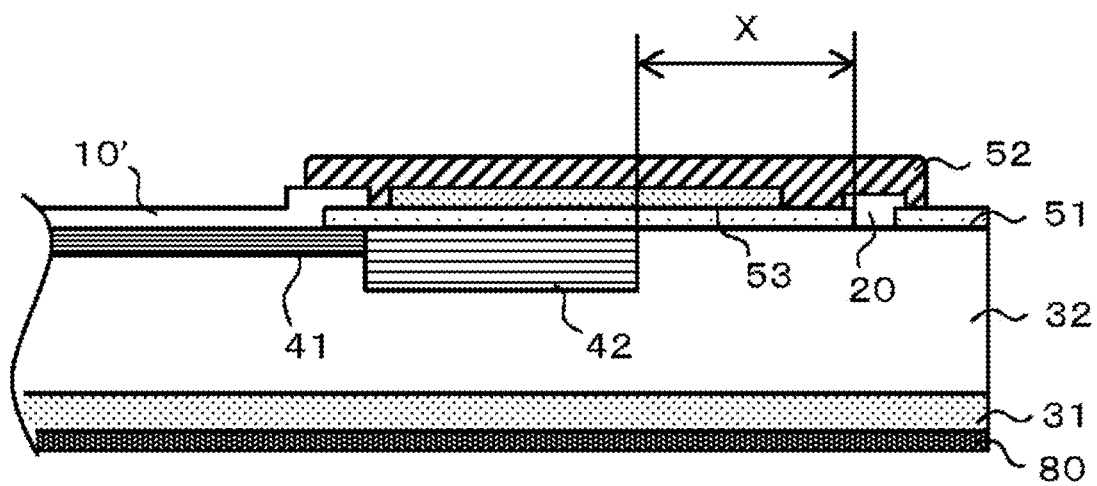
FIG. 3 is a longitudinal cross-sectional view schematically illustrating a layer configuration in a silicon carbide semiconductor device according to a modification of the first embodiment.
Figure 7:
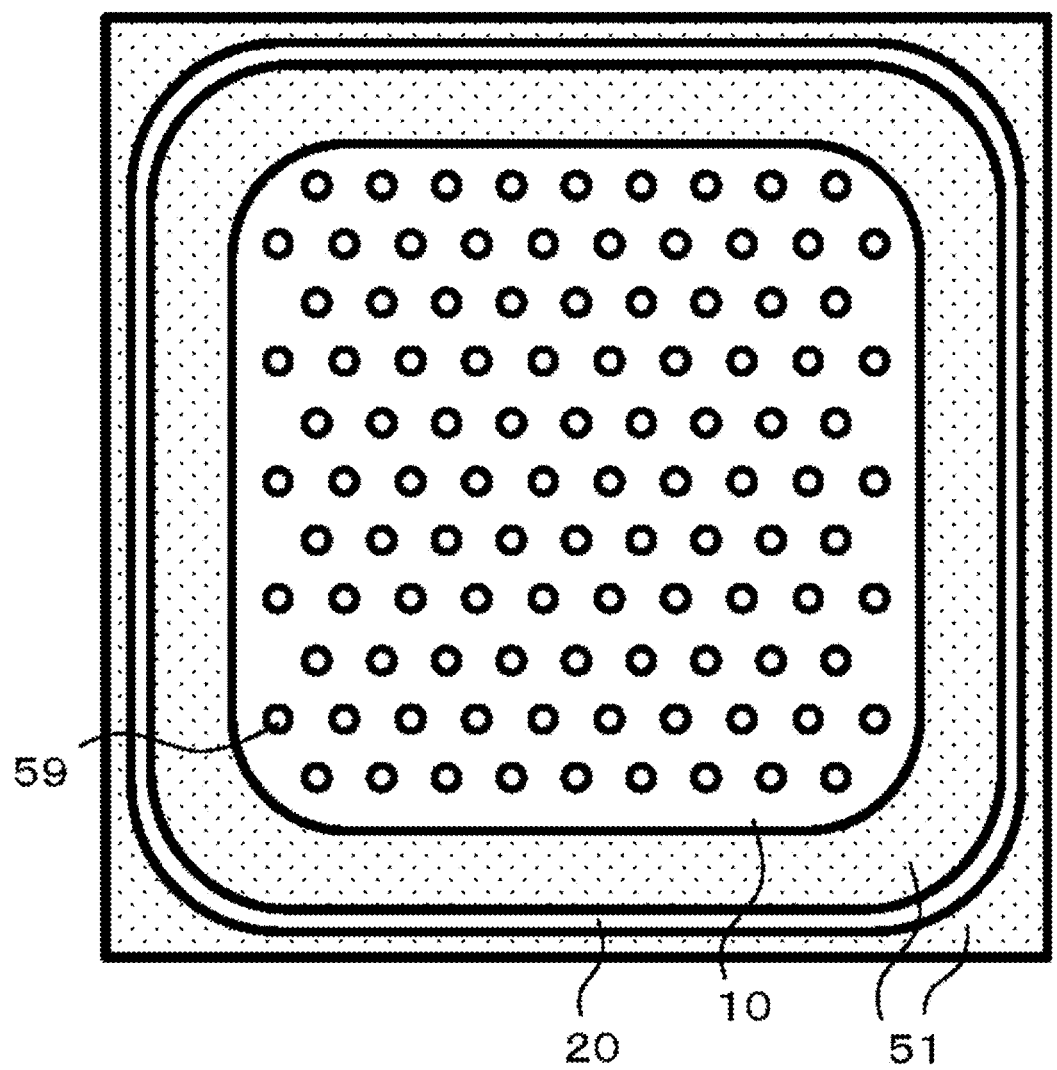
FIG. 7 is a plan view of a silicon carbide semiconductor device according to yet another modification of the first embodiment when viewed from an upper side.

The first electrode 10 and the n-type semiconductor layer 32 according to this embodiment form a schottky junction. However, the present invention is not limited thereto and as a modification, a first electrode 10' and the n-type semiconductor layer 32 or the p-type region 41 and 42 may form an ohmic junction. In an aspect illustrated in FIG. 3, the high-concentration p-type region 41 to be described below is disposed below the first electrode 10' and the high-concentration p-type region 41 and the first electrode 10' form an ohmic junction. In addition, as illustrated in FIG. 7, island-shaped p-type regions 59 may be formed in the n-type semiconductor layer 32 by forming island regions in the n-type semiconductor layer 32, the p-type region and the first electrode 10 may form an ohmic junction, and the n-type semiconductor layer 32 and the first electrode 10 may form a schottky junction.

Figure 5:
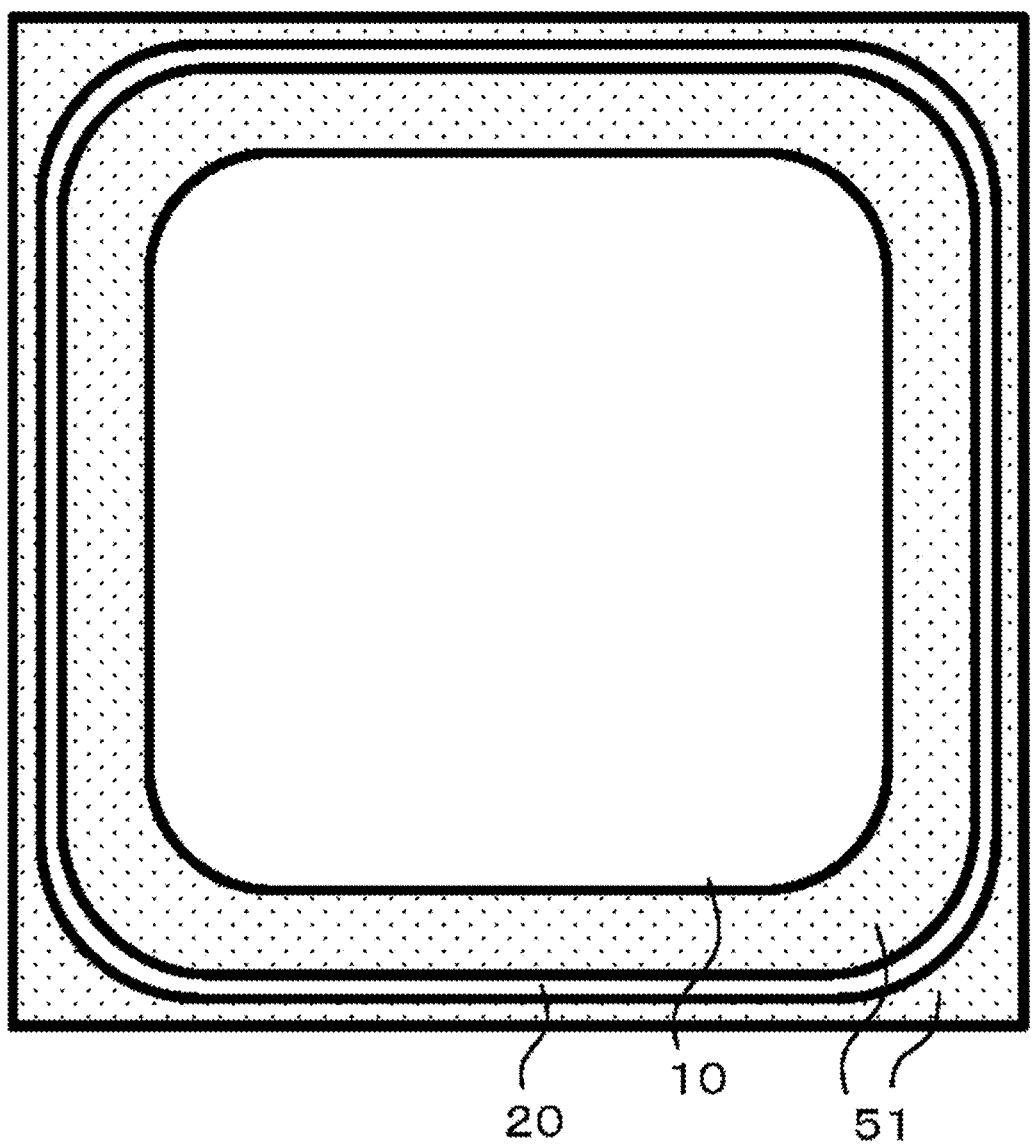
FIG. 5 is a plan view of the silicon carbide semiconductor device according to the first embodiment when viewed from an upper side.

In this embodiment, one second electrode 20 may be provided to surround some part or an entire part of the first electrode 10 continuously or intermittently (refer to FIG. 5). That is, in this embodiment, the plurality of second electrodes 20 are not provided and only one second electrode 20 may be provided. Of course, the plurality of second electrodes 20 may be provided. When the plurality of second electrodes 20 are provided, the plurality of second electrodes 20 may be provided such that some part or an entire part of one second electrode 20 may be surrounded with another second electrode 20 continuously or intermittently. In addition, the plurality of second electrodes 20 may be provided at an equivalent interval from a center part, may be provided such that the interval is gradually narrowed, or may be provided such that the interval may be gradually widened.

When some part of the first electrode 10 is surrounded with the second electrode 20, a part not surrounded with the second electrode 20 is generated. Meanwhile, when an entire part of the first electrode 10 is surrounded with the second electrode 20, the entire part of the first electrode 10 is surrounded continuously. In this embodiment, when the entire part of the first electrode 10 is surrounded continuously with the second electrode 20, this means that the second electrode 20 surrounds the entire part of the first electrode 10 continuously in a plan view (when viewed from the upper side of FIG. 1), as illustrated in FIG. 5. FIG. 5 illustrates only the first electrode 10, the second electrode 20, and the first insulating layer 51 to be described below and does not illustrate the second insulating layer 52 and the third insulating layer 53, for the convenience of description. In FIG. 5, the second electrode 20 has an approximately rectangular shape and surrounds the first electrode 10 having an approximately rectangular shape. However, the present invention is not limited thereto and the second electrode 20 may have an approximately circular shape and surround the first electrode 10.

In this embodiment, a distance X (refer to FIG. 1 or the like) between an end part of the p-type region 41 and 42 and an end part of a contact surface between the second electrode 20 and the n-type semiconductor layer 32 may be larger than a theoretical width of a depletion layer. As the theoretical width of the depletion layer, a formula (1) can be exemplified.

$$\sqrt{\frac{2\varepsilon_s V_{bi}}{qN_d}} \quad \text{(formula 1)}$$

When the distance X is larger than the theoretical width of the depletion layer, the distance X may be set to magnitude larger by 1.5 to 2 times or more than a value obtained by the formula (1). In the formula (1), $\varepsilon_s$ shows a dielectric constant of a semiconductor, $V_{bi}$ shows a built-in potential, and $N_d$ shows a donor concentration.

Figure 2:
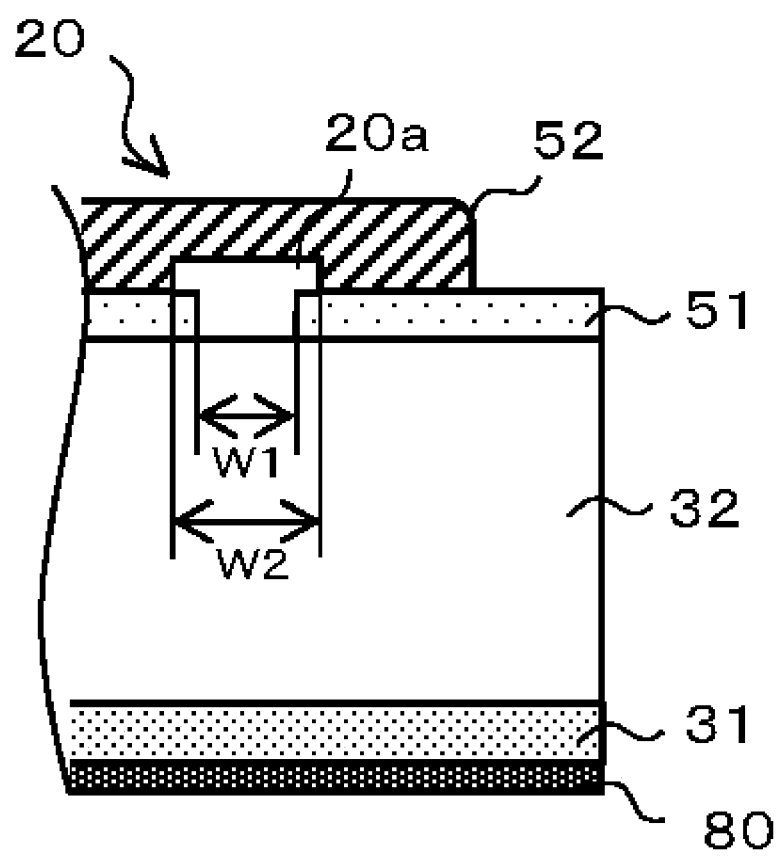
FIG. 2 is a longitudinal cross-sectional view illustrating an enlarged state of a neighboring part of a second electrode in FIG. 1.

As illustrated in FIG. 2, the second electrode 20 according to this embodiment may have a protrusion part 20a that protrudes in a planar direction on the first insulating layer 51. A width W2 of the protrusion part 20a is larger than one time of the width W1 of the contact surface of the second electrode 20 and the n-type semiconductor layer 32 and becomes 1.5 times or less of the width W1, for example. More preferably, the width W2 becomes 1.1 to 1.3 times of the width W1. Of course, the protrusion part 20a does not need to be provided. In this case, a shape of a longitudinal cross-section of the second electrode 20 becomes approximately rectangular.

As illustrated in FIG. 1, the p-type region 41 and 42 according to this embodiment have the high-concentration p-type region 41 and the low-concentration p-type region 42 having a p-type impurity concentration lower than a p-type impurity concentration of the high-concentration p-type region 41. The high-concentration p-type region 41 is positioned to be closer to the side of the first electrode 10 than the low-concentration p-type region 42, and the low-concentration p-type region 42 is provided to surround the high-concentration p-type region 41. In addition, the low-concentration p-type region 42 is deeper than the high-concentration p-type region 41. A width of the low-concentration p-type region 42 is larger than a width of the high-concentration p-type region 41. The distance X in this embodiment described above means a distance between an end part (right end of the low-concentration p-type region 42 in FIG. 1) of the low-concentration p-type region 42 and the end part (left end part of the contact surface in FIG. 1) of the contact surface between the second electrode 20 and the n-type semiconductor layer 32.

As illustrated in FIG. 1, in this embodiment, the peripheral edge part of the first electrode 10 has a stepped part 11. The stepped part 11 is provided to be placed on the first insulating layer 51. In addition, an end part (left end part of FIG. 1) of the second insulating layer 52 at the side of the first electrode 10 is provided to cover at least a part of the stepped part 11.

The silicon carbide semiconductor device according to this embodiment has an ohmic electrode 80 to be a back surface side electrode at a back surface side (lower side of FIG. 1) of the n-type semiconductor substrate 31. The ohmic electrode 80 forms an ohmic junction with the n-type semiconductor substrate 31. The ohmic electrode 80 may have a single layer structure of nickel and have a multilayer structure of nickel and titanium.

<<Manufacturing Method>>

Next, an outline of a manufacturing method of the silicon carbide semiconductor device having the configuration described above will be described. Here, an aspect where the first electrode 10 forms a schottky junction with the first conductive-type semiconductor layer 32 will be described. However, it should be noted that the aspect is only exemplary.

Figure 8:
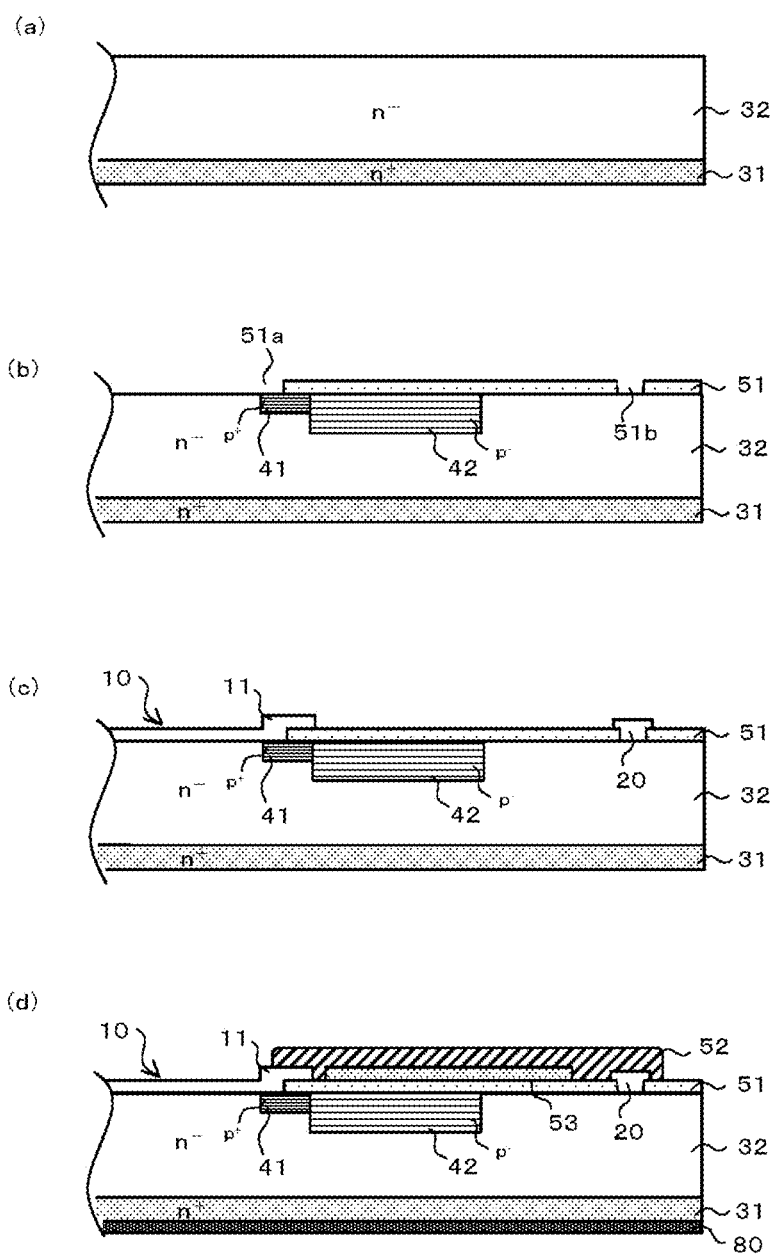
FIG. 8 *a-d* is longitudinal cross-sectional view illustrating a manufacturing method of the silicon carbide semiconductor device according to the first embodiment.

First, the high-concentration n-type semiconductor substrate 31 is prepared (refer to FIG. 8(a)).

Next, the low-concentration n-type semiconductor layer 32 is formed on the high-concentration n-type semiconductor substrate 31 by epitaxial growth (refer to FIG. 8(a)).

Next, the p-type region 41 and 42 including the low-concentration p-type region 42 and the high-concentration p-type region 41 is formed (refer to FIG. 8(b)). As such, when the p-type region 41 and 42 is formed and activated, a known method can be used. For example, a method to be described below can be used. First, a mask having an opening is formed on parts corresponding to the p-type region 41 and 42. Then, a relatively small amount of p-type impurity ions (for example, aluminum ions) are implanted into a predetermined part of the n-type semiconductor layer 32 through the mask in multiple steps, with relatively high energy. Then, the mask is removed. Next, a mask having an opening is formed on a part corresponding to the high-concentration p-type region 41. Then, a large amount of p-type impurity ions (for example, aluminum ions) are implanted into a predetermined part of the n-type semiconductor layer 32 through the mask in multiple steps, with relatively low energy. Then, the mask is removed. In addition, the p-type impurities are activated by performing heating at a temperature of 1600° C. or more, for example.

Next, the first insulating layer 51 is provided on the n-type semiconductor layer 32 and the p-type region 41 and 42. Then, an opening 51a for a first electrode is formed at a position making it possible that a part of the first insulating layer 51 is disposed on the second conductive-type regions 41 and 42 and the other part is disposed on the first conductive-type semiconductor layer 32 and an opening 51b for a second electrode is formed between the opening 51a for the first electrode and the end part of the silicon carbide semiconductor device (refer to FIG. 8(b)). At this time, both the opening 51a for the first electrode and the opening 51b for the second electrode are formed at the same time, that is, with the same process. For this reason, the opening 51b for the second electrode can be formed without providing a process different from a process for forming the opening 51a for the first electrode. As such, when the opening 51a for the first electrode and the opening 51b for the second electrode are formed, buffering hydrofluoric acid can be used, for example.

Next, the first electrode 10 is provided in the opening 51a for the first electrode and the second electrode 20 is provided in the opening 51b for the second electrode (refer to FIG. 8(c)). As such, even when the first electrode 10 and the second electrode 20 are provided, a known method can be used. For example, an electrode including titanium, nickel, and/or aluminum is provided by deposition, a chemical vapor deposition method (CVD method), an applying/coating method, an electroplating method, and the like. At this time, the second electrode 20 is formed to have the protrusion part 20a and the first electrode 10 is formed to have the stepped part 11 provided in the peripheral edge part thereof.

Next, the third insulating layer 53 is provided on the first insulating layer 51 (refer to FIG. 8(d)). Then, the second insulating layer 52 is provided to cover a part (peripheral edge part) of the stepped part 11 of the first electrode 10, an entire part of the third insulating layer 53, and an entire part of the second electrode 20.

The ohmic electrode 80 is formed on the bottom surface (back surface) of the n-type semiconductor substrate 31 (refer to FIG. 8(d)). At this time, the ohmic electrode 80 can also be formed using a known method and a metal including nickel and/or titanium, for example, is provided by the deposition, the chemical vapor deposition method (CVD method), the applying/coating method, and the electroplating method, for example.

Heating treatment is performed at appropriate timing in the process described above and at a predetermined temperature (for example, 500° C.), such that each of the first electrode 10 and the second electrode 20 forms a schottky junction with the n-type semiconductor layer 32. In addition, the heating treatment is performed at appropriate timing in the process described above and at a predetermined temperature (for example, 1000° C. or more), such that the bottom surface (back surface) of the n-type semiconductor substrate 31 and the ohmic electrode 80 form an ohmic junction.

<<Functions/Effects>>

Next, functions/effects according to this embodiment having the configuration described above will be described.

According to this embodiment, as illustrated in FIG. 1, because the insulating layer 51, 52, and 53 extends to the end part of the silicon carbide semiconductor device, the discharge can be prevented from occurring between the first electrode 10 and the end part of the silicon carbide semiconductor device.

Figure 6:
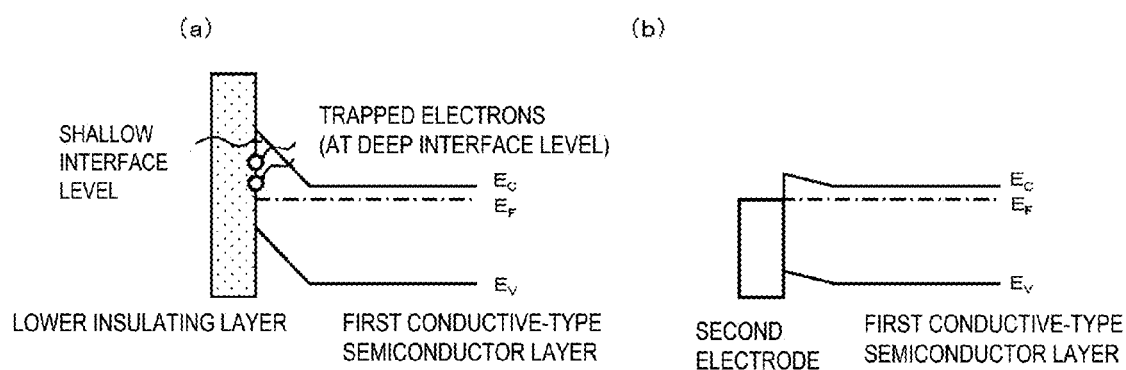
FIG. 6 is a diagram illustrating a problem resolved by the silicon carbide semiconductor device according to the first embodiment and a resolving means thereof.

Because the second electrode 20 is provided between the first electrode 10 and the end part of the silicon carbide semiconductor device, and the second electrode 20 and the n-type semiconductor layer 32 form the schottky junction, the electrons are not trapped at the corresponding position and a band is not lifted. Therefore, an "inversion layer" is not formed (refer to FIG. 6(b)). As a result, the leak current can be decreased.

In view of this point, it is also thought that a high-concentration n-type semiconductor region having a high n-type impurity concentration is provided, instead of providing the second electrode 20, and the leak current is prevented. However, when the high-concentration n-type semiconductor region is provided, an ion implantation device for a wide gap semiconductor (for example, for silicon carbide) is necessary and an enormous investment is necessary. For this reason, a manufacturing cost increases.

When the first electrode 10 forms the schottky junction with the n-type semiconductor layer 32, the first electrode 10 and the second electrode 20 can be formed of the same material and the first electrode 10 and the second electrode 20 can be formed at the same time. For this reason, the manufacturing cost can be further decreased without providing a new manufacturing process.

When the second electrode 20 according to this embodiment is provided to surround the first electrode 10 (refer to FIG. 5), there is an advantage in that the schottky junction can be formed to surround the first electrode 10 and the band is not lifted in the vicinity of the first electrode 10. When the plurality of second electrodes 20 are provided, the schottky junction can be formed in each of the second electrodes 20 and the leak current can be decreased more surely. Even when only one second electrode 20 is provided, it should be noted that an effect of decreasing the leak current can be achieved. As such, the number of second electrodes 20 is set to one, so that the manufacturing cost can be suppressed and a size of a planar direction of the semiconductor device can be suppressed from increasing.

Depending on a situation, the second electrode 20 may be provided intermittently to surround the first electrode 10 and may be provided to surround a part of the first electrode 10.

In addition, the distance X between the end part of the p-type region 41 and 42 and the end part of the contact surface between the second electrode 20 and the first conductive-type semiconductor layer 32, illustrated in FIG. 1, is set to be larger than the theoretical width of the depletion layer, so that an effect different from an effect of a general guard ring can be obtained. If the second electrode 20 is configured to function as the guard ring, the distance X is designed to become equal to or smaller than the width of the depletion layer, to alleviate a field by connecting the depletion layer and decreasing an anode potential gradually. However, an object of the second electrode 20 according to this embodiment is not to connect the depletion layer. If the grown depletion layer is beyond the second electrode 20, an effect of suppressing an inversion channel by the second electrode 20 is not sufficiently shown. For this reason, in this embodiment, the distance X is designed to become larger than the theoretical width of the depletion layer.

If a manufacturing error and other factors are considered, the distance X may be set to magnitude larger by 1.5 to 2 times or more than a value obtained by the formula (1).

$$\sqrt{\frac{2\varepsilon_s V_{bi}}{qN_d}} \qquad \text{(formula 1)}$$

By adopting this aspect, the depletion layer can be prevented from being connected unexpectedly. For example, in the case of a silicon carbide schottky barrier diode of a rating voltage of 1200 V, when $N_d$ is set to $0.8 \times 10^{16}$ cm$^{-3}$ and the rating voltage of 1200 V is applied, a minimum value of the distance X is 12.9 μm. In this case, it is thought that the distance X is designed to become about 20 μm, from the viewpoint of preventing the depletion layer from being connected unexpectedly.

Figure 4:
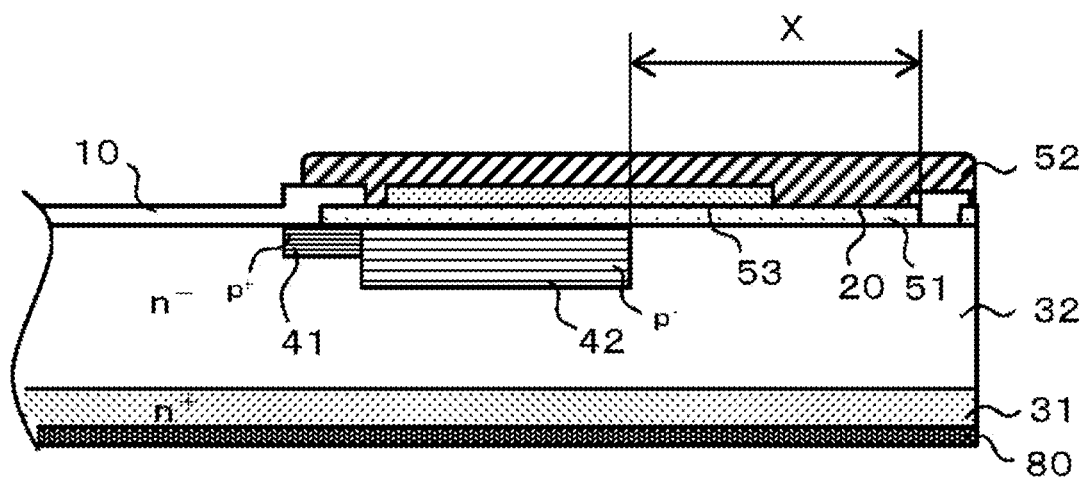
FIG. 4 is a longitudinal cross-sectional view schematically illustrating a layer configuration in a silicon carbide semiconductor device according to another modification of the first embodiment.

In addition, as illustrated in FIG. 4, the second electrode 20 may be provided in the end part of the silicon carbide semiconductor device. By adopting this aspect, the distance X can be increased and the depletion layer can be surely prevented from being connected.

When a reverse voltage is applied, the field is concentrated on the end part of the contact surface of the second electrode 20 and the n-type semiconductor layer 32.

According to studies of the present inventors, when the reverse voltage is applied, a potential difference (residual potential difference) is generated between the end face (right end face of FIG. 1) of the silicon carbide semiconductor device and a region (in FIG. 1, a region provided with the second electrode 20) recessed to the inner side. For this reason, there are concerns that a disadvantage occurs in the second electrode 20 due to the potential difference. However, when the second electrode 20 has the protrusion part 20a protruding in the planar direction on the first insulating layer 51 (refer to FIG. 2), there is an advantage in that the concentration of the field generated on the end part of the contact surface between the second electrode 20 and the first conductive-type semiconductor layer 32 can be alleviated by the protrusion part 20a. As such, to efficiently alleviate the concentration of the field generated on the end part of the contact surface between the second electrode 20 and the first conductive-type semiconductor layer 32, the width W2 of the protrusion part 20a preferably becomes 1.1 to 1.3 times of the width W1 of the contact surface of the second electrode 20 and the n-type semiconductor layer 32.

When the second electrode 20 is completely covered with the insulating layer 51, 52, and 53, the second electrode 20 is not exposed to the surface. Therefore, the discharge can be prevented from occurring between the first electrode 10 and the second electrode 20. In addition, the second electrode 20 is covered with the second insulating layer 52 different from the first insulating layer 51, so that the first electrode 10 can be covered after the first electrode 10 is provided. Therefore, manufacturing thereof is facilitated and a manufacturing cost can be suppressed.

Second Embodiment

Next, a second embodiment of the present invention will be described.

Figure 9:
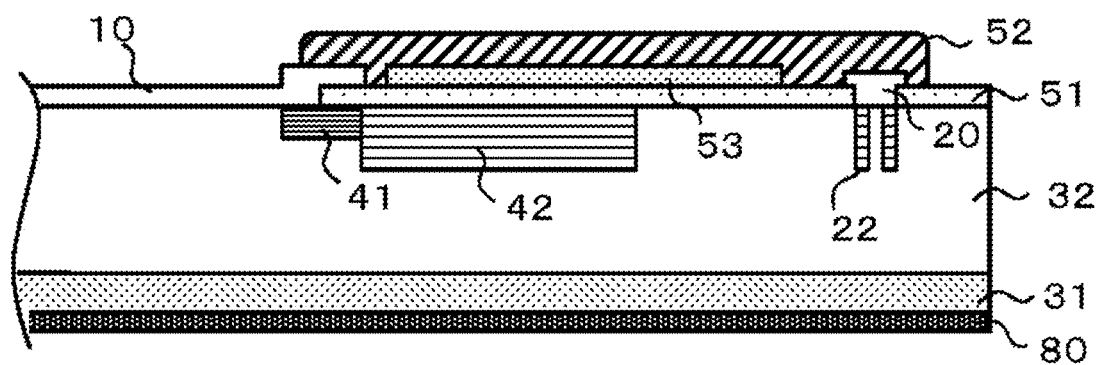
FIG. 9 is a longitudinal cross-sectional view schematically illustrating a layer configuration in a silicon carbide semiconductor device according to an aspect of a second embodiment.
Figure 10:
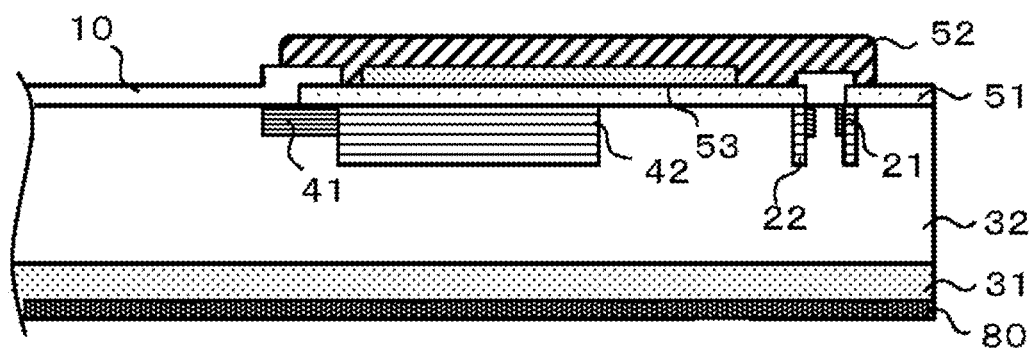
FIG. 10 is a longitudinal cross-sectional view schematically illustrating a layer configuration in a silicon carbide semiconductor device according to another aspect of the second embodiment.

In the second embodiment, an aspect where at least a part of p-type electric field alleviation region 21 and 22 (corresponding to "second conductive-type electric field alleviation region" in claims) is provided below a second electrode 20 is taken. The p-type electric field alleviation region 21 and 22 may be made of one kind of region, as illustrated in FIG. 9. However, the present invention is not limited thereto and the p-type electric field alleviation region 21 and 22 may be made of two or more kinds of regions. For example, as illustrated in FIG. 10, the p-type electric field alleviation region 21 and 22 may include a high-concentration p-type electric field alleviation region 21 (corresponding to a "high-concentration second conductive-type electric field alleviation region" in claim) and a low-concentration p-type electric field alleviation region 22 (corresponding to a "low-concentration second conductive-type electric field alleviation region" in claim) having a p-type impurity concentration lower than a p-type impurity concentration of the high-concentration p-type electric field alleviation region 21. In addition, the high-concentration p-type electric field alleviation region 21 may be positioned at an inner side of the low-concentration p-type electric field alleviation region 22. The "inner side" means a side of the second electrode 20 as illustrated in FIG. 10. In addition, the low-concentration p-type electric field alleviation region 22 may be deeper than the high-concentration p-type electric field alleviation region 21 and a width of the low-concentration p-type electric field alleviation region 22 may be larger than a width of the high-concentration p-type electric field alleviation region 21.

The p-type electric field alleviation region 21 and 22 may be provided continuously in an entire region below the second electrode 20 (refer to FIG. 5). The present invention is not limited thereto and the p-type electric field alleviation region 21 and 22 may be provided intermittently in the entire region below the second electrode 20. In addition, the p-type electric field alleviation region 21 and 22 may be provided in only some region below the second electrode 20.

In the second embodiment, the other configuration is substantially the same as the configuration of the first embodiment.

Even in this embodiment, the same effects as the effects of the first embodiment can be achieved. More specifically, in addition to the effects achieved by the first embodiment, the following effects can also be obtained.

As described above, it is known that a residual potential difference is generated between an end face of a silicon carbide semiconductor device and a region recessed to an inner side, when a reverse voltage is applied. For this reason, there are concerns that a disadvantage occurs in the second electrode 20 due to the potential difference.

However, in this embodiment, because the p-type electric field alleviation region 21 and 22 are provided below the second electrode 20, a field applied to the second electrode 20 can be alleviated and a disadvantage can be prevented from occurring in the second electrode 20. In addition, when the p-type electric field alleviation region 21 and 22 include the high-concentration p-type electric field alleviation region 21 and the low-concentration p-type electric field alleviation region 22 provided inside the high-concentration p-type electric field alleviation region 21, the field applied to the second electrode 20 can be alleviated more efficiently and it is possible to endure a high potential difference (residual potential difference). In addition, Durability to the residual potential difference increases as compared with the case of providing a "protrusion part 20a" described in the first embodiment.

Because the p-type electric field alleviation region 21 and 22 can be formed at the same timing as p-type region 41 and 42, there is an advantage in that the p-type electric field alleviation region 21 and 22 can be formed without increasing a manufacturing cost. More specifically, the high-concentration p-type electric field alleviation region 21 can be formed when the high-concentration p-type region 41 is formed and the low-concentration p-type electric field alleviation region 22 can be formed when the low-concentration p-type region 42 is formed. In addition, the high-concentration p-type region 41 and the high-concentration p-type electric field alleviation region 21 may be formed to have substantially the same depth and the low-concentration p-type region 42 and the low-concentration p-type electric field alleviation region 22 may be formed to have substantially the same depth. By using this aspect, there is an advantage in that the p-type electric field alleviation region 21 and 22 can be provided with a manufacturing cost substantially equal to a manufacturing cost in an aspect where the p-type electric field alleviation region 21 and 22 are not provided.

Lastly, descriptions on the aforementioned respective embodiments and variations as well as disclosed drawings are merely examples for describing the invention described in CLAIMS. The descriptions on the aforementioned embodiments or disclosed drawings should not be construed to limit the invention described in CLAIMS.

REFERENCE SIGNS LIST

10: first electrode
20: second electrode
20a: protrusion part
21: high-concentration p-type electric field alleviation region (high-concentration second conductive-type electric field alleviation region)
22: low-concentration p-type electric field alleviation region (low-concentration second conductive-type electric field alleviation region)
31: first conductive-type semiconductor substrate
32: first conductive-type semiconductor layer
41: high-concentration p-type region (high-concentration second conductive-type region)
42: low-concentration p-type region (low-concentration second conductive-type region)
51: first insulating layer (insulating layer)
52: second insulating layer (insulating layer)
53: third insulating layer (insulating layer)
59: island-shaped p-type region
80: ohmic electrode

What is claimed is:

1. A wide gap semiconductor device comprising:
a first conductive-type semiconductor layer;
a second conductive-type region that is provided on the first conductive-type semiconductor layer;
a first electrode, of which a part is disposed on the second conductive-type region and the other part is disposed on the first conductive-type semiconductor layer;
an insulating layer that is provided adjacent to the first electrode on the first conductive-type semiconductor layer and that extends to an end part of the wide gap semiconductor device; and
a second electrode that is provided between the first electrode and the end part of the wide gap semiconductor device and that forms a schottky junction with the first conductive-type semiconductor layer,
wherein a distance between an end part of the second conductive-type region and an end part of a contact surface between the second electrode and the first conductive-type semiconductor layer is larger than a theoretical width of a depletion layer,
wherein the theoretical width of the depletion layer is calculated based on a following formula (1)

$$\sqrt{\frac{2\varepsilon_s V_{bi}}{qN_d}} \quad \text{(formula 1)}$$

in the formula (1), $\varepsilon_s$ shows a dielectric constant of the first conductive-type semiconductor layer, $V_{bi}$ shows a built-in potential, and $N_d$ shows a donor concentration in the first conductive-type semiconductor layer.

2. The wide gap semiconductor device according to claim 1,
wherein one second electrode is provided to surround some part or an entire part of the first electrode continuously or intermittently.

3. The wide gap semiconductor device according to claim 1,
wherein the insulating layer has a first insulating layer that is provided on the first conductive-type semiconductor layer, and wherein the second electrode has a protrusion part that protrudes in a planar direction on the first insulating layer.

4. The wide gap semiconductor device according to claim 1,
wherein the insulating layer has a first insulating layer that is provided on the first conductive-type semiconductor layer, and a second insulating layer that is provided on the first insulating layer and covers the second electrode completely.

5. The wide gap semiconductor device according to claim 4,
the second electrode is not provided on the end part of the wide gap semiconductor device.

6. The wide gap semiconductor device according to claim 1,
wherein at least a part of second conductive-type electric field alleviation region is provided below the second electrode.

7. The wide gap semiconductor device according to claim 6,
wherein the second conductive-type electric field alleviation region includes a high-concentration second conductive-type electric field alleviation region, and a low-concentration second conductive-type electric field alleviation region having a second conductive-type impurity concentration lower than a second conductive-type impurity concentration of the high-concentration second conductive-type electric field alleviation region, and
wherein the high-concentration second conductive-type electric field alleviation region is positioned at an inner side of the low-concentration second conductive-type electric field alleviation region.

8. A manufacturing method of a wide gap semiconductor device comprising:
providing a second conductive-type region on a first conductive-type semiconductor layer;
providing a first electrode in such a way that a part of the first electrode is disposed on the second conductive-type region and the other part is disposed on the first conductive-type semiconductor layer;
providing a second electrode, which forms a schottky junction with the first conductive-type semiconductor layer, between the first electrode and the end part of the wide gap semiconductor device; and
providing an insulating layer that is adjacent to the first electrode on the first conductive-type semiconductor layer and that extends to an end part of the wide gap semiconductor device,
wherein a distance between an end part of the second conductive-type region and an end part of a contact surface between the second electrode and the first conductive-type semiconductor layer is larger than a theoretical width of a depletion layer, and
wherein the theoretical width of the depletion layer is calculated based on a following formula (1)

$$\sqrt{\frac{2\varepsilon_s V_{bi}}{qN_d}} \quad \text{(formula 1)}$$

in the formula (1), $\varepsilon_s$ shows a dielectric constant of the first conductive-type semiconductor layer, $V_{bi}$ shows a built-in potential, and $N_d$ shows a donor concentration in the first conductive-type semiconductor layer.

9. The manufacturing method of the wide gap semiconductor according to claim 8,
wherein the second electrode is provided when the first electrode is provided, and
wherein the first electrode forms a schottky junction with the first conductive-type semiconductor layer.

10. The manufacturing method of the wide gap semiconductor according to claim 8,
wherein a second conductive-type electric field alleviation region is provided when the second conductive-type region is provided, and
wherein the second electrode is provided over at least a part of the second conductive-type electric field alleviation region.

* * * * *